United States Patent
Zhang

(10) Patent No.: US 10,224,505 B1
(45) Date of Patent: Mar. 5, 2019

(54) METHOD FOR MANUFACTURING FLEXIBLE OLED PANEL AND FLEXIBLE OLED PANEL

(71) Applicant: Wuhan China Star Optoelectronics Semiconductor Display Technology Co., Ltd., Wuhan, Hubei (CN)

(72) Inventor: Pengzhen Zhang, Wuhan (CN)

(73) Assignee: WUHAN CHINA STAR OPTOELECTRONICS SEMICONDUCTOR DISPLAY TECHNOLOGY CO., LTD. (CN)

( * ) Notice: Subject to any disclaimer, the term of this patent is extended or adjusted under 35 U.S.C. 154(b) by 0 days.

(21) Appl. No.: 15/574,369

(22) PCT Filed: Nov. 1, 2017

(86) PCT No.: PCT/CN2017/108861
§ 371 (c)(1),
(2) Date: Nov. 15, 2017

(30) Foreign Application Priority Data

Sep. 6, 2017 (CN) .......................... 2017 1 0793594

(51) Int. Cl.
| | | |
|---|---|---|
| *H01L 27/146* | (2006.01) | |
| *H01L 51/52* | (2006.01) | |
| *H01L 51/00* | (2006.01) | |
| *H01L 51/56* | (2006.01) | |
| *H01L 27/32* | (2006.01) | |

(52) U.S. Cl.
CPC .... *H01L 51/5253* (2013.01); *H01L 27/14692* (2013.01); *H01L 27/32* (2013.01); *H01L 51/004* (2013.01); *H01L 51/0027* (2013.01); *H01L 51/0035* (2013.01); *H01L 51/0097* (2013.01); *H01L 51/52* (2013.01); *H01L 51/56* (2013.01); *H01L 2251/301* (2013.01); *H01L 2251/303* (2013.01); *H01L 2251/5338* (2013.01)

(58) Field of Classification Search
CPC .............................. H01L 27/30; H01L 51/10
See application file for complete search history.

(56) References Cited

U.S. PATENT DOCUMENTS

| | | | |
|---|---|---|---|
| 6,215,161 B1 | 4/2001 | Lee | |
| 2002/0197758 A1 | 12/2002 | Chen | |
| 2014/0342101 A1 | 11/2014 | Peng et al. | |
| 2017/0179424 A1* | 6/2017 | Lee | ..................... H01L 51/0097 |
| 2018/0175078 A1 | 6/2018 | Qin | |

FOREIGN PATENT DOCUMENTS

| | | |
|---|---|---|
| CN | 1399346 A | 2/2003 |
| CN | 104167349 A | 11/2014 |
| CN | 106024804 A | 10/2016 |

* cited by examiner

*Primary Examiner* — Cheung Lee
(74) *Attorney, Agent, or Firm* — Emerson, Thomson & Bennett, LLC; Roger D. Emerson

(57) ABSTRACT

A method for manufacturing a flexible organic light-emitting diode (OLED) panel and an OLED panel are provided. The method includes providing an organic material substrate, depositing a protective metal layer over the organic material substrate, depositing a buffer layer over the protective metal layer using a high temperature plasma enhanced chemical vapor deposition (PECVD) process, and forming a semiconductor layer over the buffer layer. The protective metal layer prevents a manufacturing process of the buffer layer from contaminating a PECVD cavity and pipe.

14 Claims, 4 Drawing Sheets

METHOD FOR MANUFACTURING FLEXIBLE OLED PANEL AND FLEXIBLE OLED PANEL

FIELD OF THE INVENTION

The present disclosure relates to a technical field of displays, and more particularly to a method for manufacturing a flexible organic light-emitting diode (OLED) panel and a flexible OLED panel.

BACKGROUND OF THE INVENTION

Flexible display technology is a research hotspot in the technical field of displays in recent years. Because flexible display technology has advantages of being thinner, less susceptible to vibration, and more lightweight, it is widely used in both civilian and military fields. Flexible displays may be defined as display panel substrates manufactured using very thin flexible substrates which can be bent to have a curvature radius of only a few centimeters or even less without compromising display of the display panels.

Currently, flexible display devices are mostly prepared using organic material substrates. An organic material substrate is covered by a thicker silicon oxide layer or silicon nitride layer as a buffer layer.

Silicon oxide buffer layers or silicon nitride buffer layers are generally deposited using low temperature or high temperature plasma enhanced chemical vapor deposition (PECVD) methods. However, film layers of the low temperature deposited buffer layers are loose and are poor water and oxygen barriers. When the high temperature deposition is used, during the deposition processes, organic dust generated by the impact of plasma directly bombarding the organic material substrates contaminates equipment cavities and pipes, thereby affecting performance of the equipment.

SUMMARY OF THE INVENTION

The present disclosure provides a method for manufacturing a flexible organic light-emitting diode (OLED) panel and a flexible OLED panel, to solve the problem of contamination generated by the impact of plasma directly bombarding organic material substrates during high temperature plasma enhanced chemical vapor deposition (PECVD) processes of buffer layers.

In order to realize the aforementioned objects, the present disclosure provides the following technical solutions.

In accordance with one aspect of the present disclosure, a method for manufacturing a flexible OLED panel is provided. The method for manufacturing the flexible OLED panel includes:

a step S10 of providing an organic material substrate, wherein material of the organic material substrate is polyimide;

a step S20 of depositing a protective metal layer over the organic material substrate, wherein the protective metal layer is resistive to corrosion;

a step S30 of depositing a buffer layer over the protective metal layer using a high temperature PECVD process;

a step S40 of forming an amorphous silicon thin film over the buffer layer; and a step S50 of performing a laser crystallization treatment on the amorphous silicon thin film, such that the amorphous silicon thin film turns into a polycrystalline silicon thin film, and then forming a semiconductor layer using a photolithography process.

In accordance with a preferred embodiment of the present disclosure, the protective metal layer is a silver metal film layer.

In accordance with a preferred embodiment of the present disclosure, the step S20 is:

depositing the silver metal film layer at room temperature over the organic material substrate using a magnetron sputtering process.

In accordance with a preferred embodiment of the present disclosure, the buffer layer is formed by a silicon oxide layer and a silicon nitride layer.

In accordance with a preferred embodiment of the present disclosure, the method for manufacturing the flexible OLED panel further includes:

a step S60 of forming a flexible OLED display device over the semiconductor layer.

In accordance with another aspect of the present disclosure, a flexible OLED panel is provided. The flexible OLED panel includes:

an organic material substrate;

a protective metal layer being resistive to corrosion, wherein the protective metal layer is disposed on a surface of the organic material substrate;

a buffer layer, wherein the buffer layer prepared using a high temperature PECVD process is disposed on a surface of the protective metal layer;

a semiconductor layer formed on a surface of the buffer layer; and a flexible OLED display device formed on a surface of the semiconductor layer.

In accordance with a preferred embodiment of the present disclosure, the protective metal layer is a silver metal film layer.

In accordance with a preferred embodiment of the present disclosure, material of the organic material substrate is polyimide.

In accordance with a preferred embodiment of the present disclosure, the buffer layer is formed by a silicon oxide layer and a silicon nitride layer.

In accordance with still another aspect of the present disclosure, a method for manufacturing a flexible OLED panel is provided. The method for manufacturing the flexible OLED panel includes:

a step S10 of providing an organic material substrate;

a step S20 of depositing a protective metal layer over the organic material substrate, wherein the protective metal layer is resistive to corrosion;

a step S30 of depositing a buffer layer over the protective metal layer using a high temperature PECVD process;

a step S40 of forming an amorphous silicon thin film over the buffer layer; and a step S50 of performing a laser crystallization treatment on the amorphous silicon thin film, such that the amorphous silicon thin film turns into a polycrystalline silicon thin film, and then forming a semiconductor layer using a photolithography process.

In accordance with a preferred embodiment of the present disclosure, the protective metal layer is a silver metal film layer.

In accordance with a preferred embodiment of the present disclosure, the step S20 is:

depositing the silver metal film layer at room temperature over the organic material substrate using a magnetron sputtering process.

In accordance with a preferred embodiment of the present disclosure, the buffer layer is formed by a silicon oxide layer and a silicon nitride layer.

In accordance with a preferred embodiment of the present disclosure, the method for manufacturing the flexible OLED panel further includes:

a step S60 of forming a flexible OLED display device over the semiconductor layer.

The present disclosure provides the method for manufacturing the flexible OLED panel and the flexible OLED panel. By preparing the protective metal layer over the organic material substrate, the high temperature PECVD process of the buffer layer is prevented from contaminating a PECVD cavity and pipe, thereby enhancing the efficiency of flexible OLED panel production.

DESCRIPTION OF THE DRAWINGS

In order to describe a technical solution in embodiments or existing technology more clearly, drawings required to be used by the embodiments or the existing technology are briefly introduced below. Obviously, the drawings in the description below are only some embodiments of the present disclosure. With respect to persons of ordinary skill in the art, under a premise that inventive efforts are not made, other drawings may be obtained based on these drawings.

DETAILED DESCRIPTION OF THE PREFERRED EMBODIMENTS

Figure 1:
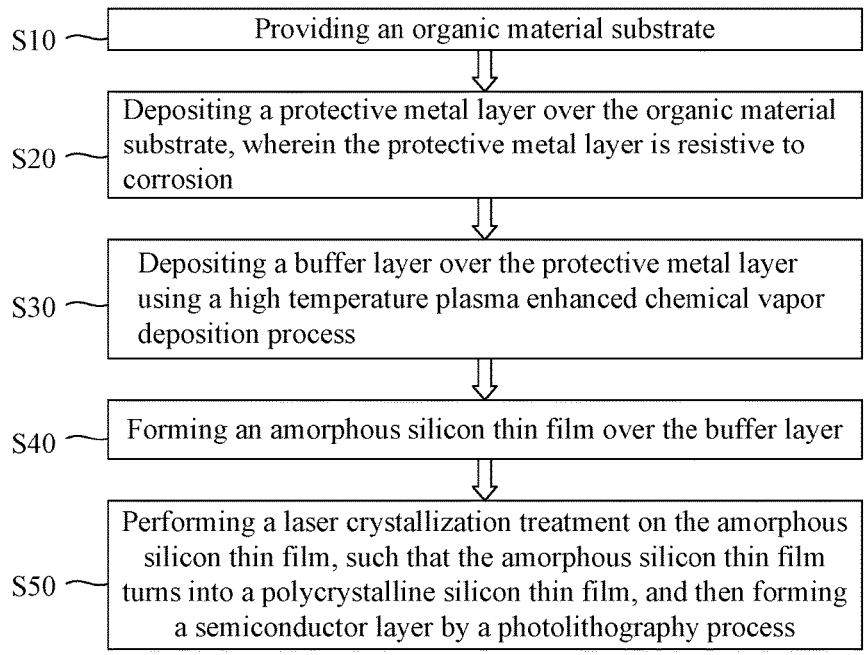
FIG. 1 is a flowchart of a method for manufacturing a flexible OLED panel in accordance with an embodiment of the present disclosure.

The description of each embodiment below refers to respective accompanying drawing(s), so as to illustrate exemplarily specific embodiments of the present disclosure that may be practiced. Directional terms mentioned in the present disclosure, such as "upper", "lower", "front", "back", "left", "right", "inner", "outer", "side", etc., are only directions by referring to the accompanying drawings, and thus the used directional terms are used to describe and understand the present disclosure, but the present disclosure is not limited thereto. In the drawings, structurally similar units are labeled by the same reference numerals.

Specific embodiments in conjunction with the drawings below further illustrate the present disclosure.

Figure 2:
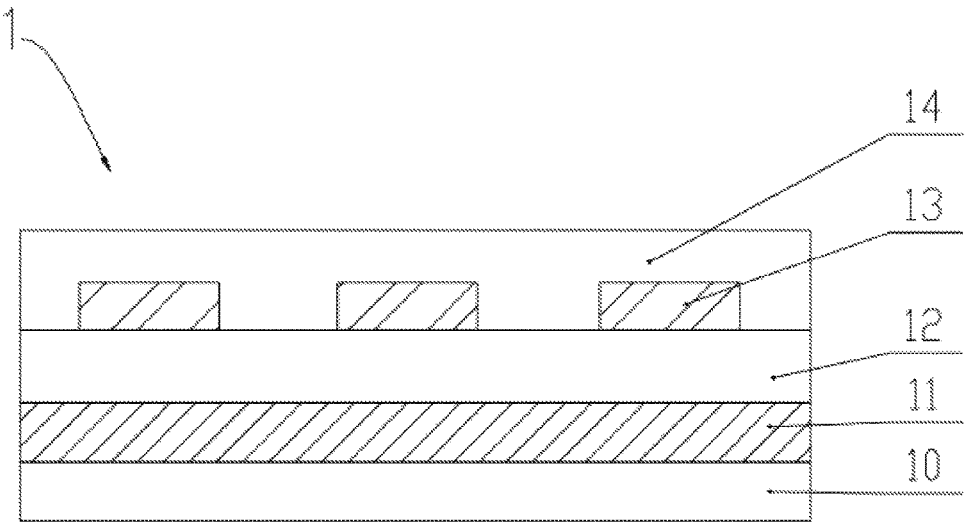
FIG. 2 is a schematic structural diagram of a flexible OLED panel in accordance with an embodiment of the present disclosure.

FIG. 1 is a flowchart of a method for manufacturing a flexible organic light-emitting diode (OLED) panel 1 in accordance with an embodiment of the present disclosure. FIG. 2 is a schematic structural diagram of the flexible OLED panel 1 in accordance with an embodiment of the present disclosure. The present disclosure provides a method for manufacturing the flexible OLED panel. The manufacturing method includes the following steps.

Figure 3A:
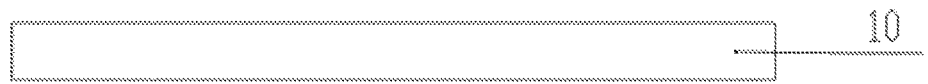
FIG. 3A-3G are a process flowchart of a method for manufacturing a flexible OLED panel in accordance with an embodiment of the present disclosure.

As illustrated in FIG. 3A, a step S10 of providing an organic material substrate 10.

The organic material substrate 10 in the step S10 is a flexible substrate of the flexible OLED panel 1. Material of the organic material substrate 10 is polyimide.

The organic material substrate 10 is a layer of a wear-resistant transparent plastic film having a high insulative property.

Figure 3B:
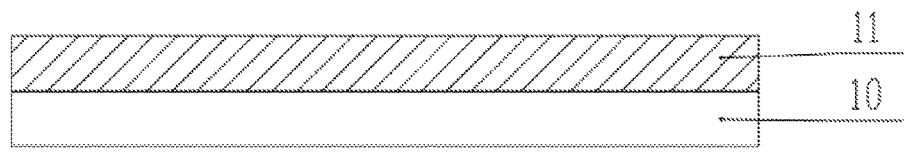

As illustrated in FIG. 3B, a step S20 of depositing a protective metal layer 11 over the organic material substrate 10. The protective metal layer 11 is resistive to corrosion.

In the step S20, the protective metal layer 11 is a silver metal film layer, which is prepared on a surface of the organic material substrate 10 using a magnetron sputtering process.

A sputtering process of the magnetron sputtering process is:

First, generate charged ions by occurrence of glow discharge phenomenon in an inert gas (usually argon).

Second, the charged ions bombard a surface of a silver target after being accelerated by an electric field, which causes silver atoms to be bombarded and fly out, and meanwhile secondary electrons to be generated. Gas atoms are further bombarded, thereby forming more charged ions.

Third, the silver target atoms with sufficient kinetic energy reach and are deposited on the surface of the organic material substrate 10, thereby forming the silver metal film layer.

The silver metal film layer not only resists corrosion well, but also has good toughness, a high melting point, and small stress, and most importantly the silver metal film layer has high reflectivity. Therefore, in the flexible top-emitting OLED display panel, ITO may be used as a transparent electrode.

Figure 3C:
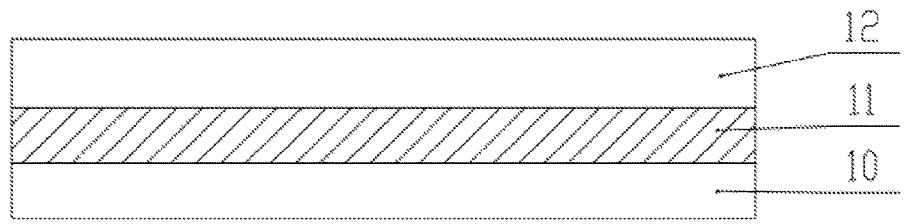

As illustrated in FIG. 3C, a step S30 of depositing a buffer layer 12 over the protective metal layer 11 using a high temperature plasma enhanced chemical vapor deposition (PECVD) process.

The PECVD process is a process in which the buffer layer 12 is deposited as a film using chemical vapor deposition in the presence of plasma.

The presence plasma may promote decomposition and synthesis of gas molecules, promote formation of reactive active groups, and meanwhile provide energy to secondary molecules diffusing to a surface of a substrate. Hence, some reactions that need to be carried out under a high temperature can be realized under a low temperature. However, a film layer of a low temperature PECVD deposited buffer layer 12 is loose, and is a poor water barrier. Therefore, in the present disclosure, the buffer layer 12 is deposited using the high temperature PECVD.

Under a high temperature environment, if plasma directly bombards the organic material substrate 10, organic dust would be generated, and the organic dust would contaminate an equipment cavity and pipe.

Because the protective metal layer 11 is disposed between the buffer layer 12 and the organic material substrate 10, during the deposition process of the buffer layer 12, plasma would not directly bombard the organic material substrate 10, thereby preventing the equipment from being contaminated.

The buffer layer 12 is usually a silicon oxide layer and/or a silicon nitride layer.

Figure 3D:
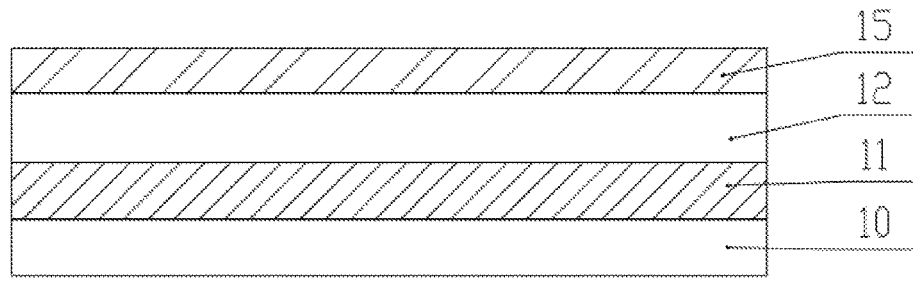

As illustrated in FIG. 3D, a step S40 of forming an amorphous silicon thin film 15 over the buffer layer 12.

In the step S40, the amorphous silicon film formation is performed over the buffer layer 12 using a PECVD process.

Figure 3E:
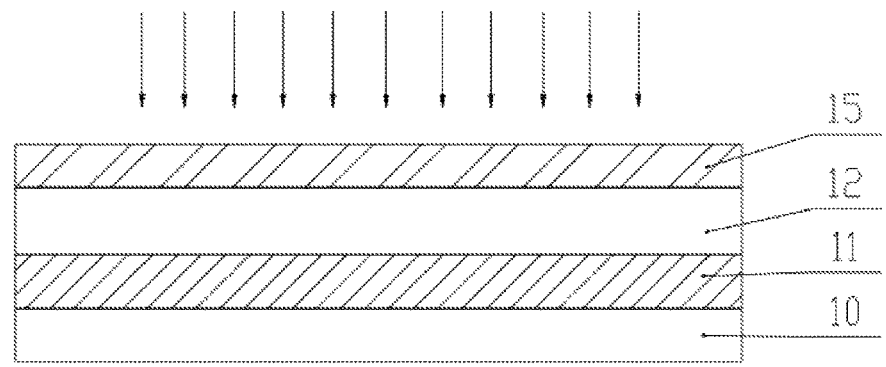
Figure 3F:
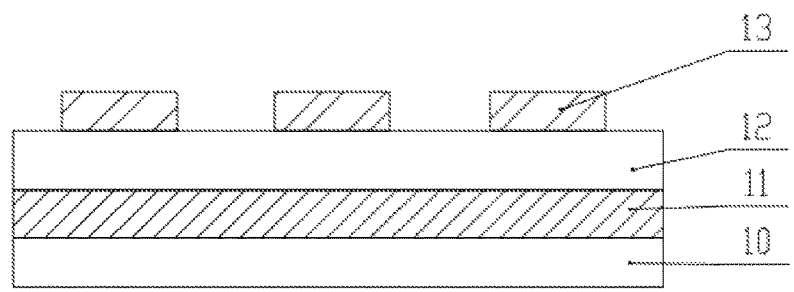

As illustrated in FIGS. 3E and 3F, a step S50 of performing a laser crystallization treatment on the amorphous silicon thin film 15, such that the amorphous silicon thin film 15 turns into a polycrystalline silicon thin film, and then forming a semiconductor layer 13 using a photolithography process.

The step S50 is: using an excimer laser annealing process, conversion of the amorphous silicon thin film 15 into the polycrystalline silicon thin film is realized. Then, using a photoresist process, the polycrystalline silicon thin film is etched, such that a polycrystalline silicon thin film with a desired pattern, i.e., the semiconductor layer 13, is obtained.

During the excimer laser annealing process, a laser usually would directly penetrate the amorphous silicon thin film 15. At this time, the buffer layer 12 may absorb the laser well, thereby preventing the organic material substrate 10 from being damaged by the laser.

Figure 3G:
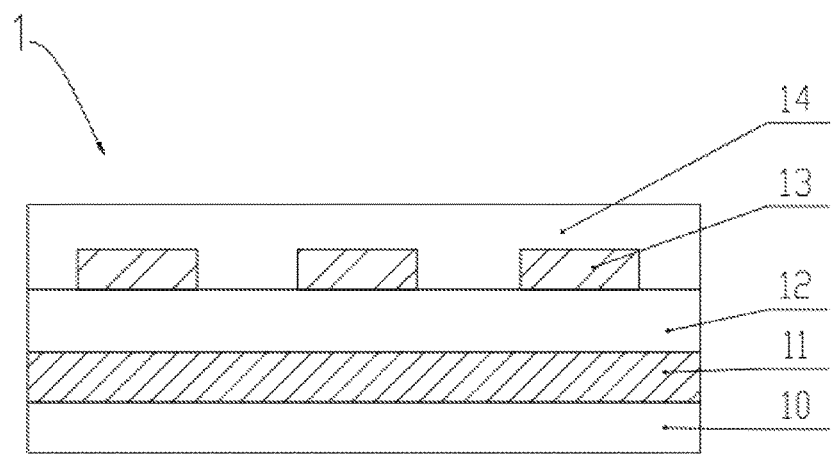

As illustrated in FIG. 3G, the method for manufacturing the flexible OLED panel 1 further includes:

a step S60 of forming a flexible OLED display device 14 over the semiconductor layer 13, thereby completing preparation of the flexible OLED panel 1.

The silver metal thin film is disposed over the organic material substrate 10. Because silver has electrical conductivity, silver may provide metal shielding function for the flexible OLED panel 1, increasing anti-interference ability of the flexible OLED panel 1. In addition, because the silver metal thin film has high reflectivity, in the flexible top-emitting OLED display panel, ITO may be used as the transparent electrode.

Figure 4:
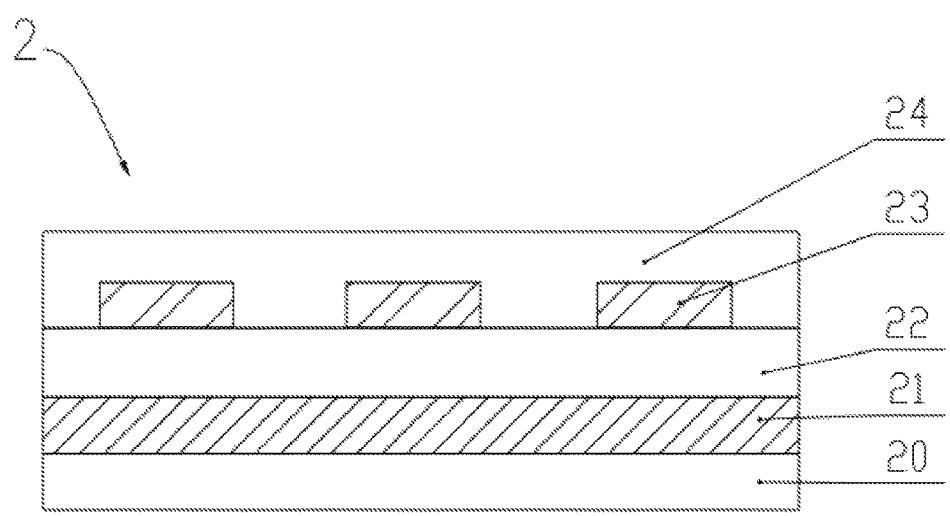
FIG. 4 is a schematic structural diagram of a flexible OLED panel in accordance with another embodiment of the present disclosure.

As illustrated in FIG. 4, the present disclosure further provides a flexible OLED panel 2. The flexible OLED panel 2 includes an organic material substrate 20, a protective metal layer 21, a buffer layer 22, a semiconductor layer 23, and a flexible OLED display device 24.

The organic material substrate 20 is a flexible substrate of the flexible OLED panel 2. Material of the organic material substrate 20 is polyimide.

The protective metal layer 21 is resistive to corrosion. The protective metal layer 21 is disposed on a surface of the organic material substrate 20. The protective metal layer 21 is a silver metal film layer, which is prepared on a surface of the organic material substrate 20 using a magnetron sputtering process.

The silver metal film layer not only resists corrosion well, but also has good toughness, a high melting point, and small stress, and most importantly the silver metal film layer has high reflectivity. Therefore, in the flexible top-emitting OLED display panel, ITO may be used as a transparent electrode.

The buffer layer 22 prepared using a high temperature PECVD process is disposed on a surface of the protective metal layer 21. The buffer layer 22 is usually a silicon oxide layer and/or a silicon nitride layer.

The semiconductor layer 23 is formed on a surface of the buffer layer 22. The semiconductor layer 23 is an amorphous silicon thin film 15 turned into a polycrystalline silicon thin film through laser crystallization, and then etched to form a polycrystalline silicon thin film with a predetermined pattern.

The flexible OLED display device 24 is formed on a surface of the semiconductor layer 23.

The protective metal layer 21 disposed over the organic material substrate 20 is used for preventing a high temperature PECVD process of the buffer layer 22 from contaminating a PECVD cavity and pipe.

The present disclosure provides the method for manufacturing the flexible OLED panel and the flexible OLED panel. By preparing the protective metal layer over the organic material substrate, the high temperature PECVD process of the buffer layer is prevented from contaminating a PECVD cavity and pipe, thereby enhancing the efficiency of flexible OLED panel production.

In summary, although the present disclosure has been described with preferred embodiments thereof above, it is not intended to be limited by the foregoing preferred embodiments. Persons skilled in the art can carry out many changes and modifications to the described embodiments without departing from the scope and the spirit of the present disclosure. Therefore, the protection scope of the present disclosure is in accordance with the scope defined by the claims.

What is claimed is:

1. A method for manufacturing a flexible organic light-emitting diode (OLED) panel, comprising:
   a step S10 of providing an organic material substrate, wherein material of the organic material substrate is polyimide;
   a step S20 of depositing a protective metal layer over the organic material substrate, wherein the protective metal layer is resistive to corrosion;
   a step S30 of depositing a buffer layer over the protective metal layer using a high temperature plasma enhanced chemical vapor deposition (PECVD) process;
   a step S40 of forming an amorphous silicon thin film over the buffer layer; and
   a step S50 of performing a laser crystallization treatment on the amorphous silicon thin film, such that the amorphous silicon thin film turns into a polycrystalline silicon thin film, and then forming a semiconductor layer using a photolithography process.

2. The method for manufacturing the flexible OLED panel of claim 1, wherein the protective metal layer is a silver metal film layer.

3. The method for manufacturing the flexible OLED panel of claim 2, wherein the step S20 is:
   depositing the silver metal film layer at room temperature over the organic material substrate using a magnetron sputtering process.

4. The method for manufacturing the flexible OLED panel of claim 1, wherein the buffer layer is formed by a silicon oxide layer and a silicon nitride layer.

5. The method for manufacturing the flexible OLED panel of claim 1, wherein the method for manufacturing the flexible OLED panel further comprises:
   a step S60 of forming a flexible OLED display device over the semiconductor layer.

6. A flexible OLED panel, comprising:
   an organic material substrate;
   a protective metal layer being resistive to corrosion, wherein the protective metal layer is disposed on a surface of the organic material substrate;
   a buffer layer, wherein the buffer layer prepared using a high temperature PECVD process is disposed on a surface of the protective metal layer;
   a semiconductor layer formed on a surface of the buffer layer; and
   a flexible OLED display device formed on a surface of the semiconductor layer.

7. The flexible OLED panel of claim 6, wherein the protective metal layer is a silver metal film layer.

8. The flexible OLED panel of claim 6, wherein material of the organic material substrate is polyimide.

9. The flexible OLED panel of claim 6, wherein the buffer layer is a silicon oxide layer and a silicon nitride layer.

10. A method for manufacturing a flexible OLED panel, comprising:

a step S10 of providing an organic material substrate;

a step S20 of depositing a protective metal layer over the organic material substrate, wherein the protective metal layer is resistive to corrosion;

a step S30 of depositing a buffer layer over the protective metal layer using a high temperature PECVD process;

a step S40 of forming an amorphous silicon thin film over the buffer layer; and a step S50 of performing laser crystallization treatment on the amorphous silicon thin film, such that the amorphous silicon thin film becomes a polycrystalline silicon thin film, and then forming a semiconductor layer using a photolithography process.

11. The method for manufacturing the flexible OLED panel of claim 10, wherein the protective metal layer is a silver metal film layer.

12. The method for manufacturing the flexible OLED panel of claim 11, wherein the step S20 is:

depositing the silver metal film layer at room temperature over the organic material substrate using a magnetron sputtering process.

13. The method for manufacturing the flexible OLED panel of claim 10, wherein the buffer layer is formed by a silicon oxide layer and a silicon nitride layer.

14. The method for manufacturing the flexible OLED panel of claim 10, wherein the method for manufacturing the flexible OLED panel further comprises:

a step S60 of forming a flexible OLED display device over the semiconductor layer.

\* \* \* \* \*